(12) United States Patent
Serbetli et al.

(10) Patent No.: US 10,256,846 B2
(45) Date of Patent: Apr. 9, 2019

(54) NON-UNIFORM QUANTIZATION OF LOG LIKELIHOOD RATIOS

(71) Applicant: NXP B.V.

(72) Inventors: Semih Serbetli, Eindhoven (NL); Marinus van Splunter, Eindhoven (NL)

(73) Assignee: NXP B.V., Eindhoven (NL)

( * ) Notice: Subject to any disclaimer, the term of this patent is extended or adjusted under 35 U.S.C. 154(b) by 264 days.

(21) Appl. No.: 14/983,729

(22) Filed: Dec. 30, 2015

(65) Prior Publication Data

US 2016/0226528 A1    Aug. 4, 2016

(30) Foreign Application Priority Data

Jan. 30, 2015   (EP) .................................. 15153340

(51) Int. Cl.
*H03M 13/45* (2006.01)
*H03M 13/00* (2006.01)
(Continued)

(52) U.S. Cl.
CPC ......... *H03M 13/45* (2013.01); *G06F 11/1004* (2013.01); *H03M 13/6502* (2013.01);
(Continued)

(58) Field of Classification Search
CPC ............. H03M 13/45; H03M 13/6502; H03M 13/6577; H03M 13/6588; H03M 13/112;
(Continued)

(56) References Cited

U.S. PATENT DOCUMENTS

| 2007/0019761 A1 | 1/2007 | Park et al. |
| 2009/0103601 A1 | 4/2009 | Du et al. |
| 2016/0105199 A1* | 4/2016 | Wu ...................... H03M 13/112 714/752 |

FOREIGN PATENT DOCUMENTS

| WO | WO 2014/029425 A9 | 2/2014 |
| WO | WO 2014/070074 A1 | 5/2014 |

OTHER PUBLICATIONS

Baggen, S. et al. Using R0 for Determining the Quantization of the input of a Viterbi Decoder on Fading Channels, Proceedings of the 24th Symposium on Information Theory, 10 pgs. (May 2003).
(Continued)

*Primary Examiner* — Shelly A Chase
(74) *Attorney, Agent, or Firm* — Rajeev Madnawat

(57) ABSTRACT

A method of processing a signal by non-uniform quantization of log likelihood ratios is disclosed. A method comprising the steps of: receiving a plurality of bits; calculating a log likelihood ratio, known as a LLR, for each bit; providing a LLR value for each bit based on the calculated LLR; quantizing the LLR values into a plurality of quantization bins, each quantization bin having: a width representative of one or more LLR values; and an index value having a bit length; and associating each bit with the index value that corresponds to its LLR value, wherein the width of each quantization bin is non-uniform. This compresses the LLR values in a more efficient manner, requiring lower memory usage and/or lower bandwidth. A chip for a receiver and a communication system comprising one or more receivers are also disclosed.

18 Claims, 11 Drawing Sheets

(51) Int. Cl.
*G06F 11/10* (2006.01)
*H04L 1/00* (2006.01)
*H03M 7/40* (2006.01)
*H03M 13/11* (2006.01)
*H03M 13/23* (2006.01)
*H03M 13/29* (2006.01)
*H04L 25/06* (2006.01)

(52) U.S. Cl.
CPC ... *H03M 13/6577* (2013.01); *H03M 13/6588* (2013.01); *H03M 13/6594* (2013.01); *H04L 1/0071* (2013.01); *H03M 7/40* (2013.01); *H03M 13/1111* (2013.01); *H03M 13/23* (2013.01); *H03M 13/2957* (2013.01); *H04L 1/0045* (2013.01); *H04L 25/067* (2013.01)

(58) Field of Classification Search
CPC .............. H03M 13/23; H03M 13/1111; H03M 13/2957; H03M 15/6577
See application file for complete search history.

(56) References Cited

OTHER PUBLICATIONS

Danieli, M. et al. "Maximum Mutual Information Vector Quantization of Log-Likelihood Ratios for Memory Efficient HARQ Implementations", Data Compression Conference, pp. 30-39 (Mar. 2010).

Kurkoski, B.M. et al. "Quantization of Binary-Input Discrete Memoryless Channels", IEEE Trans.on Information Theory, vol. 60, No. 8, pp. 4544-4552 (Aug. 2014).

Rosati, S. et al. "LLR Compression for BICM Systems Using Large Constellations", IEEE Trans. on Communications, vol. 61, No. 7, pp. 2864-2875 (Jul. 2013).

Thibault, L. "Performance evaluation of COFDM for digital audio broadcasting, Part I: Parametric study", IEEE Trans. on Broadcasting, vol. 43, No. 1, pp. 64-75 (Mar. 1997).

Webb, J.L.H. "Efficient table access for reversible variable-length decoding",IEEE Trans.on Circuits and Systems for Video Technology, vol. 11, No. 8, pp. 981-985 (Aug. 2001).

Extended European Search Report for EP Patent Appln. No. 15153340.3 (Jul. 8, 2015).

* cited by examiner

NON-UNIFORM QUANTIZATION OF LOG LIKELIHOOD RATIOS

CROSS-REFERENCE TO RELATED APPLICATIONS

This application claims the priority under 35 U.S.C. § 119 of European Patent application no. 15153340.3, filed on Jan. 30, 2015, the contents of which are incorporated by reference herein.

The disclosure relates to processing a signal by non-uniform quantization of log likelihood ratios. In particular, the disclosure relates to a method of processing a signal by non-uniformly quantizing the log likelihood ratios of the signal and a chip configured to undertake the method. A communication system comprising one or more receivers, each one or more receivers having said chip is additionally disclosed.

Signal processing for data communication, particularly in wireless channels, can be complicated due to multipath effects. For wireless signals, depending on whether reflected signals add up coherently or out of phase, a received signal may be in a good channel or in a deep fade. To overcome the negative effects of poor deep fade channels, wireless systems are designed to insert redundancies in the transmitted signal so that faded signals can be reconstructed at the receiver side. This is done by the use of channel coding such as convolutional coding, turbo coding or low density parity check (LDPC) codes etc. To make channel coding more robust against fading effects, the encoded bits are interleaved such that the bits that experience similar channels, e.g., good channels or faded channels, are spread all over different parts of the channel codes so that they can be corrected in a more efficient way. Thus, interleaving plays an important role in wireless communication systems. As the size of the interleaving of bits is increased, the system becomes more robust against fading effects.

Typically, when a signal is sent, first the bits are encoded with a channel coder, e.g., a FEC (Forward Error Correction) block and redundancy bits are inserted. Next these bits are interleaved over a different time and frequency of the signal so that they experience different channels in the interleaver block. The bits are then modulated and sent over the wireless channel. At the receiver side, the transmitted bits are demodulated and the reliability information of each bit is computed by log-likelihood-ratios (LLRs). This information is also called soft-bits. The LLRs are used by the receiver to determine the likelihood that the value of a received bit is either a 0 or a 1 (for a digital signal). The LLRs can have a different resolution depending on the design choice. The deinterleaver block rearranges the positions of the LLRs and feeds them to the FEC decoder to be processed.

To overcome the fading effects of the wireless channel, the digital audio broadcasting (DAB) standard chose the interleaver size as 384 ms. Thus, the deinterleaver block needs to store the LLRs during the 384 ms duration so that it can feed the LLRs to the FEC decoder correctly. Every standard has its own design choice of interleaving size. As the size of the interleaver is increased, the number of softbits to be stored increases, leading to larger memory cost if the bits need be stored on the receiver or leading to a higher data rate link cost to send this data if the bits are sent to another block outside of the receiver.

The interleaver/deinterleaver memory is a large part of a wireless receiver. Accordingly, if a large interleaving size is chosen, this choice increases the cost of the receiver. One conventional way of reducing this cost is to reduce the number of bits used by the memory to represent the LLRs. However, as investigated in "*Performance evaluation of COFDM for digital audio broadcasting. I. Parametric study, Thibault, L.; Minh Thien Le, IEEE Transactions on Broadcasting, Volume:* 43, *Issue:* 1, 1997, *Page(s)*: 64-75", as the number of levels, i.e. bits used, to represent the LLRs is decreased, the FEC decoder works less efficiently, correcting less erroneous bits which decreases the reliability of reception. Thus, for example in a DAB receiver, the listener hears lower quality audio signal or in a digital video broadcasting-second generation (DVB-T2) receiver, the viewer experiences more video frame errors.

In a conventional receiver, the LLRs are generated in N bits, stored and read in N bits, deinterleaved and fed to the FEC decoder still in N bit accuracy. Thus, the accuracy of the LLRs does not change until it is used by a FEC decoder.

In a conventional distributed reception system, the distributed receivers compute the LLRs of each bit and send this information to another master processing unit that performs de-interleaving and FEC decoding. In this case, each receiver requires a data link to the master processing unit with minimum data rate of (N×T×1/r) where N is the resolution of the LLRs, T is the net throughput of the data intended to be decoded and r is the FEC coding rate.

In both the above described examples, the memory requirement of the interleaver/de-interleaver is high. One conventional way of reducing the memory requirement is to use a fixed step size and apply a uniform quantization over the LLRs. "*On the Use of the Cut-Off Rate for Determining Optimal Input Quantization of a Viterbi Decoder on Fading Channels, Stan Baggen, Sebastian Egner, and Bertrand Vandewiele, Proceedings of the* 24*th Symposium on Information Theory in the Benelux May* 22-23, 2003, *Veldhoven, The Netherlands.*" investigates how the step size should be chosen for different signal-noise ratios (SNRs) and number of bits per softbits.

When a conventional uniform quantization method is used (for example for DAB), the DAB reception performance gets worse as the number of bits per LLR is decreased. When the above described conventional way of applying a uniform quantization is used, the loss in performance is significant with respect to floating point performance.

The present disclosure aims to address at least some of the above described concerns by aiming to represent the LLRs in a more efficient way than conventional uniform quantization. In some cases this may lead to the reduction of the memory or transmission cost of these LLRs. In some cases, this may lead to a reduced cost on memory and/or a reduced cost of sending the LLRs to another system for channel decoding.

According to a first aspect of the present disclosure, there is provided a method of processing a signal, said method comprising the steps of: receiving a plurality of bits; calculating a log likelihood ratio, known as a LLR, for each bit; providing a LLR value for each bit based on the calculated LLR; quantizing the LLR values into a plurality of quantization bins, each quantization bin having: a width representative of one or more LLR values; and an index value having a bit length; and associating each bit with the index value that corresponds to its LLR value, wherein the width of each quantization bin is non-uniform.

By utilising non-uniform width bins during quantization of the LLR values, the width of each bin may be tailored according to the fidelity of the incoming signal. For example, in areas of higher uncertainty as to the value of the incoming bit (i.e. bits with an LLR value around zero), the bin width assigned to the LLR value may be smaller and thus the LLR is compressed by a lower amount than in other regions where the LLR values are higher (either positive or negative). In some embodiments, this may lead to a greater performance than quantizing in a uniform manner.

Use of non-uniform quantization/compression to represent the LLRs may allow for a greater compression efficiency with limited number of bits in some embodiments.

After being stored and/or sent through a different block and deinterleaved, the information may be decompressed to a level where a FEC decoder or some other processing block can process the LLRs directly.

In some examples, the cost of storing the LLRs and/or sending them to another processing unit may be reduced while the non-uniform quantization/compression unit may be responsible to minimize the loss in performance due to compression/quantization.

The step of quantizing the LLR values may further comprise the step of determining the width of the plurality of quantization bins based on a probability density of LLR values.

The step of quantizing the LLR values may further comprise the step of determining the width of the plurality of quantization bins based on a range of LLR values. In this manner, the width of the quantization bins may depend upon the relative range of LLR values (or LLRs) generated or calculated.

In both such cases the width of the plurality of the quantization bins may be adaptively determined based on the calculated LLRs. This adaptive quantization may allow the resolution of the compression applied by non-uniform quantization to be tailored depending upon the probability of the LLR values (i.e. the strength of the incident signal). This may also provide a means to compensate for fading effects, providing, in some cases, a more robust channel coding.

The step of providing a LLR value for each bit may comprise the step of assigning each bit with a LLR value equal to its calculated LLR. Alternatively, the step of providing a LLR value for each bit can further comprise the steps of: quantizing the calculated LLRs into a plurality of LLR bins, each LLR bin having: a uniform width representative of one or more LLRs; and an interim index value having a bit length; and assigning each bit with an LLR value equal to the interim index value that corresponds to its LLR bin. In other words, the non-uniformly quantized index values can be either generated directly, such as by a modified demodulator, or LLRs can first be uniformly quantized in a conventional way to generate LLR values based on uniformly quantized interim index values, and then non-uniform quantization can be applied on the uniformly quantized LLRs.

The step of quantizing the calculated LLRs into a plurality of LLR bins may comprise uniformly quantizing the calculated LLRs into an integer number of LLR bins represented by an interim index value having a number of bits equal to the binary logarithm of the integer number of LLR bins. As an example, $2^N$ number of LLR bins could be represented by N bit interim index values. In theory the number of bins could also be any number. This could result in a fractional number of code bits. For example: 10 bins can be coded as a code from 0-9 of which 9 codes will fit into a 32 bits number, giving ~3.5 bits per index or interim index value.

For the step of associating each bit with the index value that corresponds to its LLR value, a table may be used to convert the LLR value of each bit to an index value.

Similarly, the step of quantizing the LLR values into a plurality of quantization bins can comprise non-uniformly quantizing the LLR values into an integer number of quantization bins represented by an index value having a number of bits equal to the binary logarithm of the integer number of quantization bins. As an example, up to $2^n$ number of quantization bins could be represented by n bit index values.

It can be appreciated that the bit lengths of the index values are variable between quantization bins. This allows variable length representation of index values.

Further compression of the index values may be achieved by separating the signs and magnitudes of the index values; and applying data compression methods on the magnitudes of the index values.

Providing a LLR value for each bit may further comprise the steps of: identifying M number of modulated bits from the wireless signal, where M is at least 2; pairing the LLR of the M or more modulated bits to form an LLR pair; indexing the LLR pair within an M-dimensional array; and determining a LLR value based on the location of the LLR pair within the array. This approach may provide an ensemble for each bit, allowing an aggregated LLR for each symbol (i.e. the modulated bits) to be determined.

Once calculated, the method may also comprise the steps of storing the plurality of bits and their associated index values within a memory module; providing the plurality of bits and their associated index values to a de-interleaver; de-quantizing the index values to extract decompressed LLR values for each bits; and providing the decompressed LLR values and the bits to a decoder for extraction of decoded bits of the signal.

According to a second aspect of the present disclosure there is provided a chip for a receiver configured to process a signal, the chip configured to: receive a signal comprising a plurality of bits; and process the signal according to the method of any preceding claim.

The non-uniformly quantized index values can be either generated directly by a modified demodulator or LLRs can be uniformly quantized in a conventional way first, and then non-uniform quantization can be applied on the uniformly quantized LLRs.

According to a third aspect of the present disclosure, there is provided a communication system comprising one or more receivers, at least one of the one or more receivers having a chip as defined in the second aspect of the present disclosure.

The teachings of the present disclosure can also be applied to distributed receiver architectures where some distributed radios generate the LLRs from the received signals and a master processing unit receives the LLRs from different radios, combines and decodes them.

The proposed aspects can be applied to individual LLRs or a set of LLRs. When the proposed approach is applied to individual LLRs, the deinterleaver processing and storing to a memory, or sending the LLRs to another block are not affected by the proposed approach since all the information is included in the non-uniformly quantized/compressed LLR information. However, if the approach is applied to a set of LLRs, e.g., the LLRs are non-uniformly quantized together, then the LLRs may be processed together since the information is embedded depending on the other LLR values as in jpeg or mpeg compression methods. Thus, it may require some changes to the blocks using the non-uniformly quantized/compressed LLR values. Additionally, the proposed aspects can be applied to different modulation sizes, e.g., binary phase-shift keying (BPSK), quadrature phase-shift keying (QPSK), M-quadrature amplitude modulation (M-QAM), M-phase-shift keying (M-PSK) and their differential versions.

The described aspects may be applicable to wireless communication systems with large interleaver memory such as digital radio, TV standards and satellite communication systems. The proposed aspects may aim to reduce the memory requirements of such receivers.

Additionally, the proposed aspects may be applicable to systems where the LLRs are sent to a master processing unit to be processed further. An example of such a system is distributed receiver architectures where the distributed slave receivers only generate the LLRs of bits and send these to a master processing unit to be processed further. A more specific example is a distributed Intelligent Transport System (ITS) in a car where distributed chips send the LLRs to each other to further combine the LLRs to get a more reliable reception of signals.

Another system where such kind of approaches may be applicable is low power radios with physical size constraints such as in Internet of Things devices or medical devices such as hearing aids. As discussed above FECs help to improve the reception quality in such devices. However, these add a memory cost to these devices. The proposed solution aims to reduce the memory cost of such devices.

There may be provided a computer program, which when run on a computer, causes the computer to configure any apparatus, including a circuit, controller, sensor, filter, or device disclosed herein or perform any method disclosed herein. The computer program may be a software implementation, and the computer may be considered as any appropriate hardware, including a digital signal processor, a microcontroller, and an implementation in read only memory (ROM), erasable programmable read only memory (EPROM) or electronically erasable programmable read only memory (EEPROM), or a chip as non-limiting examples. The software implementation may be an assembly program.

The computer program may be provided on a computer readable medium, which may be a physical computer readable medium, such as a disc or a memory device, or may be embodied as a transient signal. Such a transient signal may be a network download, including an internet download.

These and other aspects of the disclosure will be apparent from, and elucidated with reference to, the embodiments described hereinafter.

Embodiments will be described, by way of example only, with reference to the drawings, in which FIG. 1 is a block diagram of a signal processing system able to undertake methods according to an embodiment;

Figure 17:
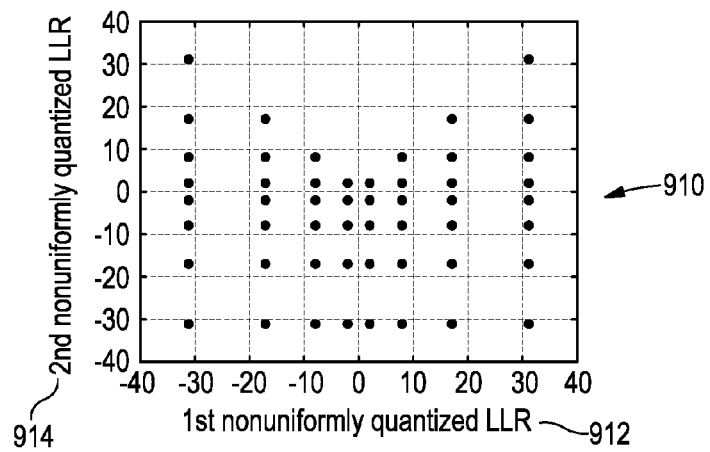
Figure 18:
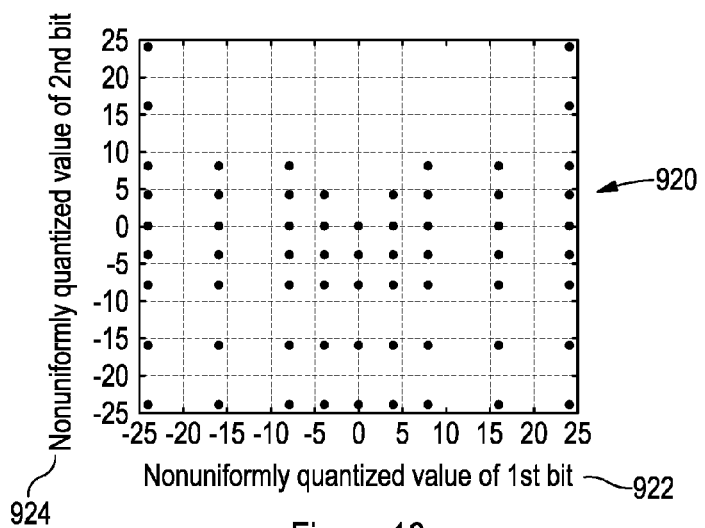

FIG. 17 shows 3 bit individually nonuniformly quantized LLR realizations of bits from 4-PAM modulated bits with Gray encoding according to an embodiment; and FIG. 18 shows 3 bit joint non-uniformly quantized LLR realizations of bits from 4-PAM modulated bits with Gray encoding according to an embodiment.

It should be noted that the Figures are diagrammatic and not drawn to scale. Relative dimensions and proportions of parts of these Figures have been shown exaggerated or reduced in size, for the sake of clarity and convenience in the drawings. The same reference signs are generally used to refer to corresponding or similar feature in modified and different embodiments.

Figure 1:
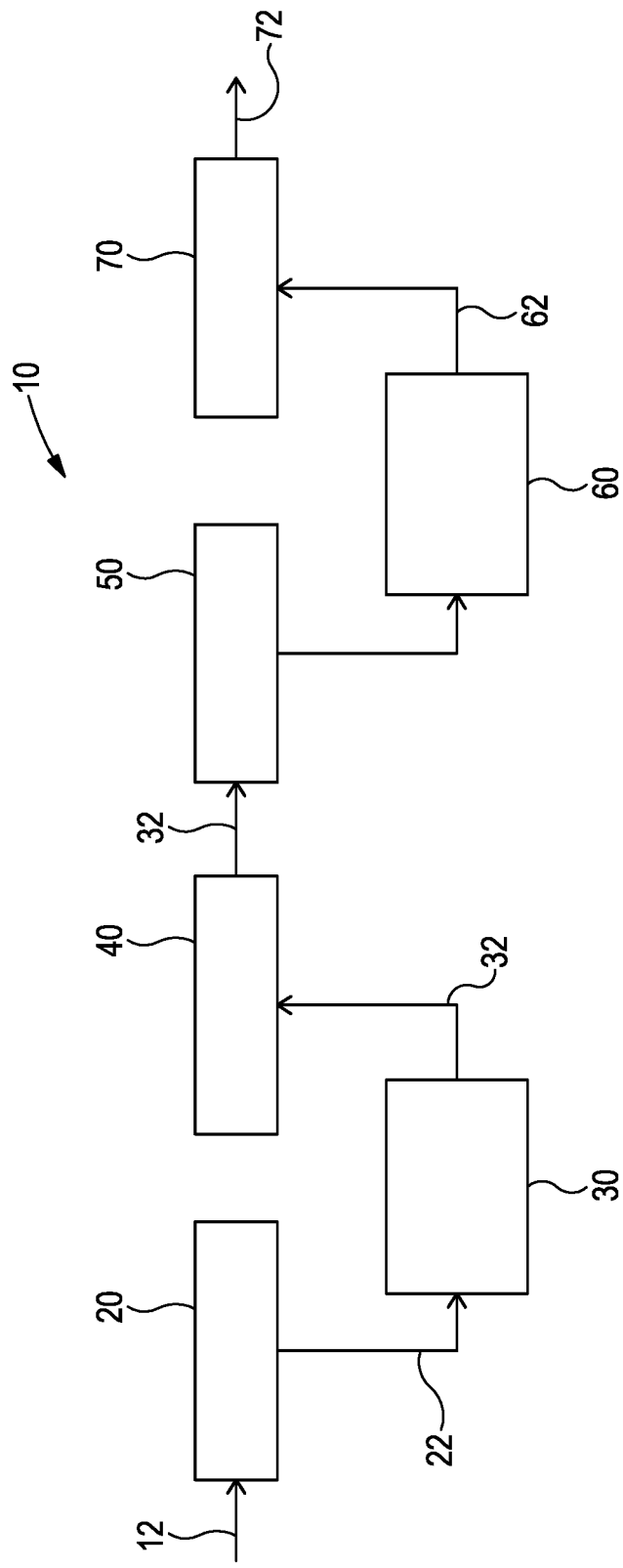

FIG. 1 shows a block diagram of a signal processing system 10, such as found in a receiver, according to an embodiment of the present disclosure. In a conventional system, bits or symbols are received by a demodulator. Log likelihood ratios, known as LLRs, (i.e. the likelihood that the received bit represents a 0 or a 1) are calculated with an accuracy of N bits (e.g. 5 bits) for each bit or symbol and this information is stored in memory as an N bit integer. The N bit LLRs can then be provided to a deinterleaver to be deinterleaved and fed to a FEC decoder, again in N bit accuracy, to generate decoded bits.

In embodiments of the present disclosure, received bits 12 are received by a demodulator 20 that calculates LLRs for each incident bit. As noted, for a perfect signal, the received bits are 0 or 1 depending upon the information conveyed by the signal. However, due to interference and noise effects, the values of the bits are values away from the ideal. Accordingly, log likelihood ratios (LLRs) are calculated for each received bit or signal that provides a value representative of the likelihood that the value of the received bit is either 0 or 1. This information is then used to deinterleave and decode the information from the received bits 12. The LLRs have a value represented by an N bit integer.

Once demodulated, the N bit LLR values 22 are provided to a quantization module 30 where non-uniform quantization is performed on the values 22 to compress the values from N bit to (N−ns) bits where N is the number of bits used to represent the original LLR value, (N−ns) is the number of bits used to represent the non-uniform quantized LLR values and ns is the number of bits saved. The quantization module 30 may be a separate module or may be integrated into the demodulator 20.

The (N−ns) bit non-uniform quantized LLRs are called index values 32. For example, if the quantization module 30 compresses the 5 bit LLR values 22 to 4 bit index values 32, this results in a 20% saving in the amount of memory space required to store the index values 32. Compressing from 5 bits to 3 bits results in a 40% memory saving.

The index values 32 are then stored within memory 40. The values 32 may be stored for a duration according to the interleaving size of the chosen standard, for example 384 ms for the DAB standard. Alternatively, the index values 32 may be provided to an external device for further processing. Once requested by a deinterleaver 50, the index values 32 are provided by the memory 40 to the deinterleaver 50. The deinterleaver 50 then deinterleaves the received bits 12. The index values 32 and the received bits 12 can then be dequantized in a non-uniform dequantization module 60, which may be a separate module or integrated into the deinterleaver 50.

The dequantization module 60 decompresses the index values to obtain LLRs for each received bit 12. The decompressed N bit LLRs 62 are then provided to a FEC encoder 70 for decoding and output of decoded bits 72.

Figure 2:
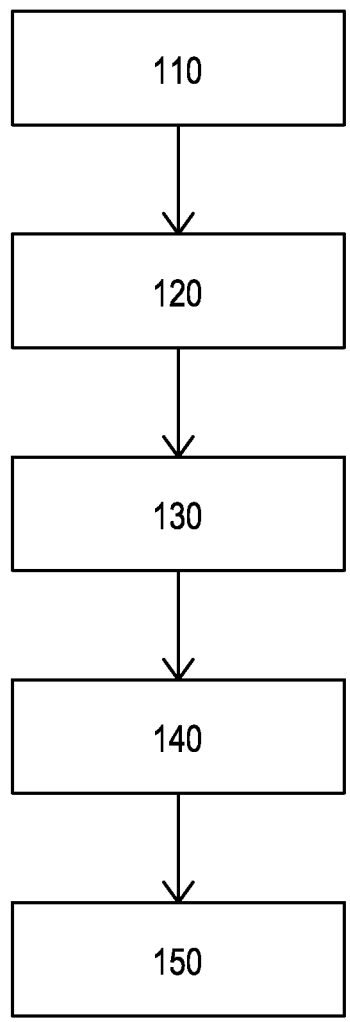
FIG. 2 is a block diagram of a method of undertaking non-uniform quantization according to an embodiment.

FIG. 2 shows a method used to process a signal, and in particular a method to non-uniformly quantize LLRs. As shown in FIG. 1, a signal is received 110 comprising bits. For each bit a LLR is calculated 120. An LLR value, which may be the value of the LLR, is then provided 130 to each bit based on the calculated LLR. The LLR values are then quantized 140 into a plurality of quantization bins. Each quantization bin has a width representative of one or more LLR values and an index value having a bit length. Each bit can then be associated 150 with the index value that corresponds to its LLR value.

Figure 3:
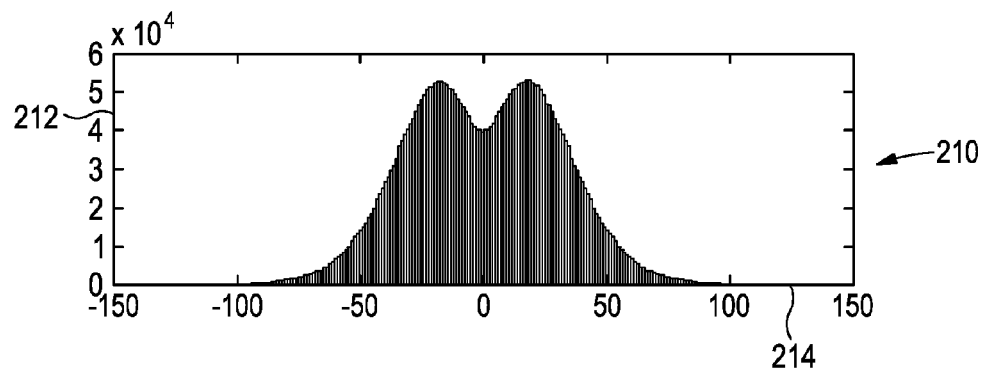
FIG. 3 is an example LLR histogram for a signal for processing according to an embodiment.

The width of the plurality of quantization bins are typically determined based on the probability density of the LLR values. FIG. 3 shows an example of a LLR distribution 210 in an additive white Gaussian noise (AWGN) channel with 10 Hz of Doppler frequency before fitting to 5 bits. In FIG. 3, the y-axis 212 represents a frequency count indicating probability density, with the x-axis 214 representing the value of the LLR, which is dimensionless. For each received bit, its LLR is calculated. FIG. 3 represents a plot of this raw data of LLRs for every received bit.

Figure 4:
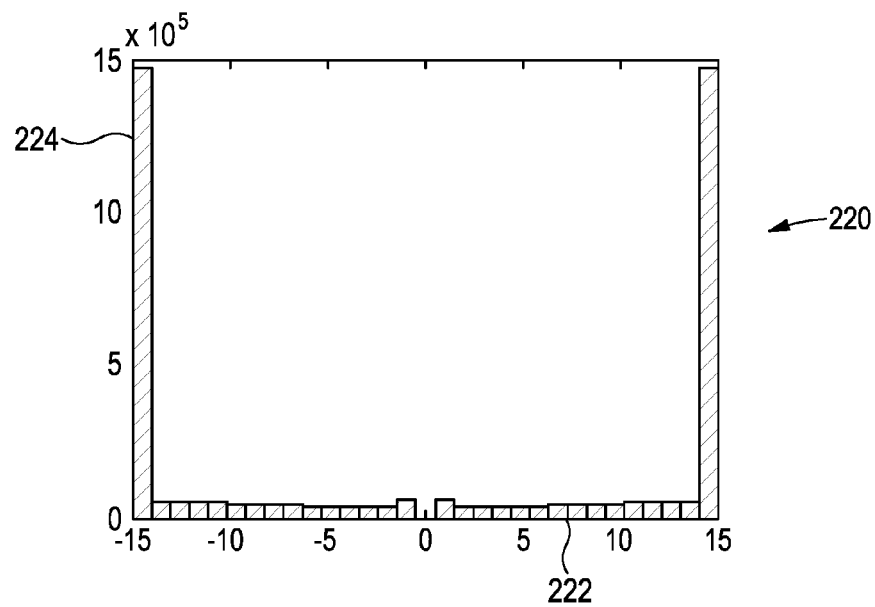
FIG. 4 shows the example LLR histogram of FIG. 3 after fitting to 5 bits.

FIG. 4 shows the example LLR histogram 220 of FIG. 3 in a DAB receiver at a carrier/noise (C/N) of 6 dB in an AWGN channel after fitting to 5 bits and $2^5$ bins 222 or levels. The y-axis 224 represents a frequency count indicating probability density. As can be seen in FIG. 4, bins −15 and 15 have the largest frequency count. This is because all LLR values lower than, for example, −25 on FIG. 3 are collated within a single bin, the −15 bin of FIG. 4. In other words, high (positive or negative) LLR values indicate a high certainty that the value of the bit for which the LLR was calculated was either 0 (e.g. for negative LLRs) or 1 (for positive LLRs). In FIG. 3, all values with a value greater than 25 may be considered to have a high certainty of being either 0 or 1 (depending upon the sign of the LLR). For a bit with an LLR nearer to 0, the degree of uncertainty in the value of the bit is higher.

In FIG. 3, the LLRs are distributed around 0, and are a combination of two Gaussian distributions, i.e., one representing +1 and the other is representing −1. After fitting to 5 bits, in FIG. 4, the width of the bins used, other than a large portion of the values being saturated to the maximum and minimum value, e.g., −15 and 15 for a 5 bit representation, are broadly evenly distributed over the other values, almost uniformly.

Figure 5:
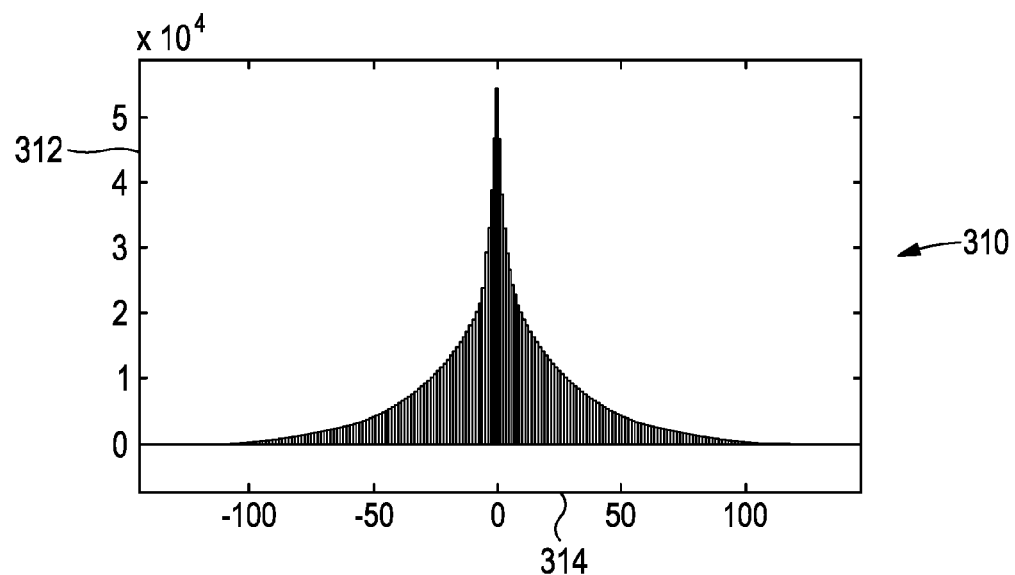
FIG. 5 shows an alternative embodiment LLR histogram.
Figure 6:
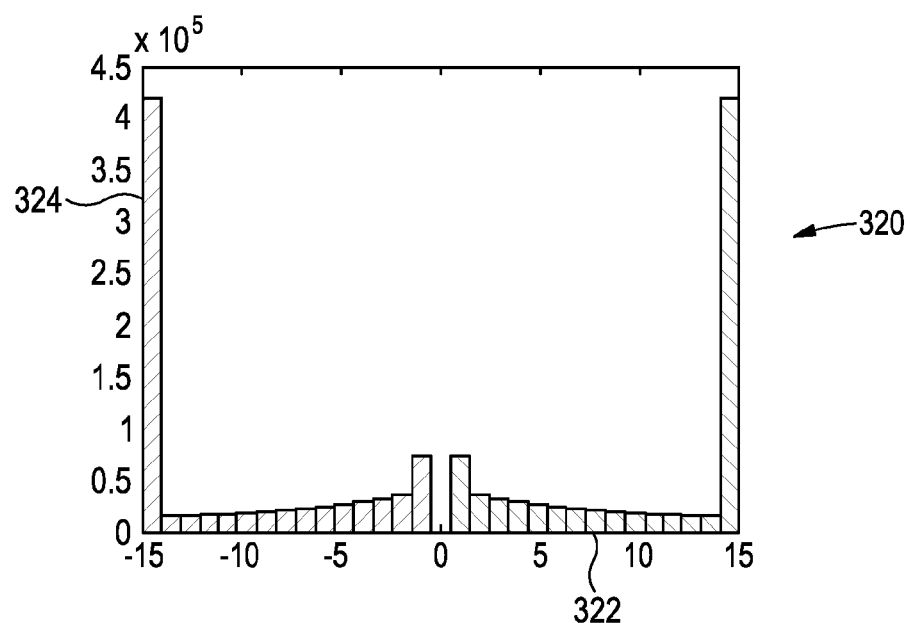
FIG. 6 shows the example LLR histogram of FIG. 5 after fitting to 5 bits.

FIG. 5 shows an example LLR histogram 310 in DAB receiver at C/N=10 dB in a 6-tap typical urban-6 (TU-6) channel with 10 Hz Doppler frequency before fitting to 5 bits. Again, the y-axis 312 represents a frequency count indicating probability density, with the x-axis 314 representing the value of the LLR, which is dimensionless FIG. 6 shows an example LLR histogram 320 in DAB receiver at C/N=10 dB in TU-6 channel with 10 Hz Doppler frequency after fitting to 5 bits and $2^5$ bins 322 or levels. The y-axis 324 represents a frequency count.

In FIG. 5, the LLRs are broadly distributed around 0. However, contrary to the AWGN case, there is no apparent combination of two Gaussian distributions, in the TU-6 channel, i.e., there are not two peaks with one representing +1 and the other representing −1. This is due to fading effects which act as a multiplicative noise to LLRs. After fitting to 5 bits, it can be observed again that a large portion of the values are saturated to the maximum and minimum value, e.g., −15 and 15 for a 5 bit representation. However, the remaining LLRs are not evenly distributed over the other values, i.e., a significant portion of LLRs have lower magnitudes, e.g., from −5 to −1 and from 1 to 5.

The observations of FIGS. 3 to 6 allow the design of a better representation of LLRs with limited number of bits. The channel realizations for different scenarios are typically somewhere between the two channel models identified above. Typically, if there is a strong line-of-sight component in the received signal, the channel will look like more an AWGN channel. Conversely, if no line of sight component exists, it will look like a TU-6 channel with a number of fading effects.

Due to this spread between disparate channels, it is possible to undertake a non-uniform quantization of the LLRs to compress the values of the LLRs. In doing so, it is sometimes necessary to look at the histograms of the LLRs and make minimum distortions to the existing histogram. Such non-uniform quantization should not introduce additional quantization noise on the maximum and minimum values, and should not introduce additional quantization noise on the LLRs with lower magnitudes, e.g., from −5 to −1 and from 1 to 5.

In order to preserve the information of the LLR values of lower magnitude, a smaller quantization step is chosen for these values to maintain the accuracy of these values. Conversely, for LLRs with larger magnitudes, a less accurate, i.e. a larger quantization step can be used. For example, the LLRs with maximum and minimum values, e.g., 15 and −15 values in the examples, are kept the same or with minimum distortion. It is then possible to quantize the LLRs directly non-uniformly following the above guidelines. Alternatively, it may be desirable to first generate a uniformly quantized LLRs with N bit representation and compress/quantize it further to represent LLRs with less bits. We choose to show the second approach to also observe how the LLRs are affected after non-uniform quantization/compression.

An example non-uniform quantization/compression from 5 bit to 4 and 3 bit is tabulated in Table 1 below and in FIG. 7. Note that in the table, 5 bit LLR values (i.e. 32 or $2^5$ LLR bins or levels, each LLR bin having an interim index value) are converted to be represented by 16 different quantization bins or levels, each having an index value (−15, −12, −9, −6, −4, −3, −2, −1, 1, 2, 3, 4, 6, 9, 12, 15), i.e. $2^n$ levels, where n is the bit length of the nonuniform quantization index values (so 4 in this example). After non-uniform quantization/compression, each quantization bin or level can be represented by a 4 bit value, which can be interpreted as the index value or index bits. A conversion table can then be used to associate index values or index bits to the value of the actual LLRs.

TABLE 1

5 bit to 4 bit non-uniform quantization conversion table

| 5 bit LLR input | 4 bit non-uniform LLR output | 4 bit LLR representation in memory |
|---|---|---|
| −16 | −15 | 0000 |
| −15 | −15 | 0000 |
| −14 | −12 | 0001 |
| −13 | −12 | 0001 |
| −12 | −12 | 0001 |
| −11 | −12 | 0001 |
| −10 | −9 | 0010 |
| −9 | −9 | 0010 |
| −8 | −9 | 0010 |
| −7 | −6 | 0011 |
| −6 | −6 | 0011 |
| −5 | −4 | 0100 |
| −4 | −4 | 0100 |
| −3 | −3 | 0101 |
| −2 | −2 | 0110 |
| −1 | −1 | 0111 |
| 0 | 0 | Not represented |
| 1 | 1 | 1000 |
| 2 | 2 | 1001 |
| 3 | 3 | 1010 |
| 4 | 4 | 1011 |
| 5 | 4 | 1011 |
| 6 | 6 | 1100 |
| 7 | 6 | 1100 |
| 8 | 9 | 1101 |
| 9 | 9 | 1101 |
| 10 | 9 | 1101 |
| 11 | 12 | 1110 |
| 12 | 12 | 1110 |
| 13 | 12 | 1110 |
| 14 | 12 | 1110 |
| 15 | 15 | 1111 |

It can appreciated that any integer number of bins may be chosen. In such cases, each bin can be represented by an index value having $\log_2$(Number of bins) bits. If the number of bins is not a power of two, and would therefore result in a non-integer number of bits for the index value, then it may paired with other values to be represented by an integer number of bits. This could result in a fractional number of code bits. For example: 10 bins can be coded as a code from 0-9 of which 9 codes will fit into a 32 bits number, giving ~3.5 bits per index value.

Figure 7:
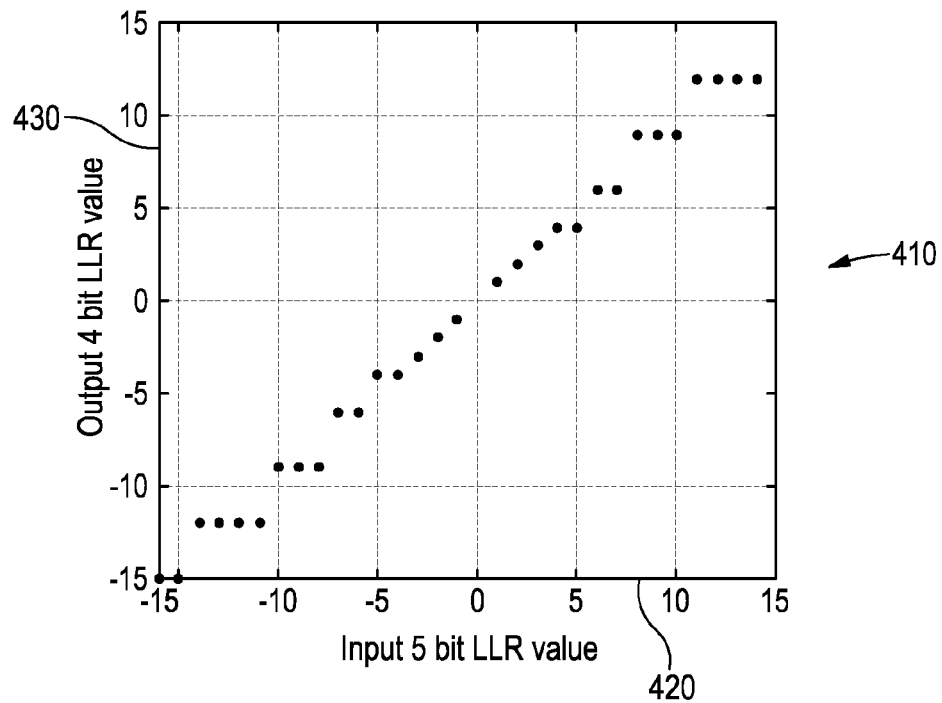
FIG. 7 shows a graph of a conversion of a set of uniformly quantized 5 bit input LLR values to an output of a set of 4 bit non-uniformly quantized output LLR values according to an embodiment.

FIG. 7 shows a graphical representation 410 of the information within table 1 plotting the input 5 bit LLR values 420 against the output 4 bit LLR values or index values 430. In particular, it can be seen that the compression is higher at the higher negative and positive 5 bit LLR input values, whilst values around 0, where the LLRs, and thus the 5 bit LLR values, have a lower magnitude have lower compression. It can be noted that the $2^5$ number of quantization LLR bins or levels of the original LLRs have been consolidated to $2^4$ number of quantization bins. Each 4 bit bin is assigned an index value based on the 5 bit LLR values input into the 4 bit bin. For example, 5 bit inputs −16, −15 are consolidated to 4 bit index value 0000 representing compressed LLR value of −15, whilst 5 bit inputs −14, −13, −12, −11 are consolidated to 4 bit index value 0001 representing compressed LLR value of −12, etc. In this manner, the uniformly quantized input LLR values are compressed into non-uniformly quantized index values whereby the width of the quantization bins of the index values are non-uniform compared to the uniform width of the LLR bins of LLR values.

More broadly, an N bit input of LLR values uniformly quantized into $2^N$ bins may be consolidated into (N-ns) bit input of quantization with $2^{(N-ns)}$ bins, where N is the bit length of the original LLR values, (N-ns) is the bit length of the non-uniformly quantized index values and ns is the number of bits saved.

TABLE 2

5 bit to 3 bit non-uniform quantization conversion table

| 5 bit LLR input | 3 bit non-uniform LLR output | 3 bit LLR representation in memory |
|---|---|---|
| −16 | −15 | 000 |
| −15 | −15 | 000 |
| −14 | −15 | 000 |
| −13 | −15 | 000 |
| −12 | −15 | 000 |
| −11 | −15 | 000 |
| −10 | −8 | 001 |
| −9 | −8 | 001 |
| −8 | −8 | 001 |
| −7 | −8 | 001 |
| −6 | −4 | 010 |
| −5 | −4 | 010 |
| −4 | −4 | 010 |
| −3 | −4 | 010 |
| −2 | −1 | 011 |
| −1 | −1 | 011 |
| 0 | 0 | Not represented |
| 1 | 1 | 100 |
| 2 | 1 | 100 |
| 3 | 4 | 101 |
| 4 | 4 | 101 |
| 5 | 4 | 101 |
| 6 | 4 | 101 |
| 7 | 8 | 110 |
| 8 | 8 | 110 |
| 9 | 8 | 110 |
| 10 | 8 | 110 |
| 11 | 15 | 111 |
| 12 | 15 | 111 |
| 13 | 15 | 111 |
| 14 | 15 | 111 |
| 15 | 15 | 111 |

Figure 8:
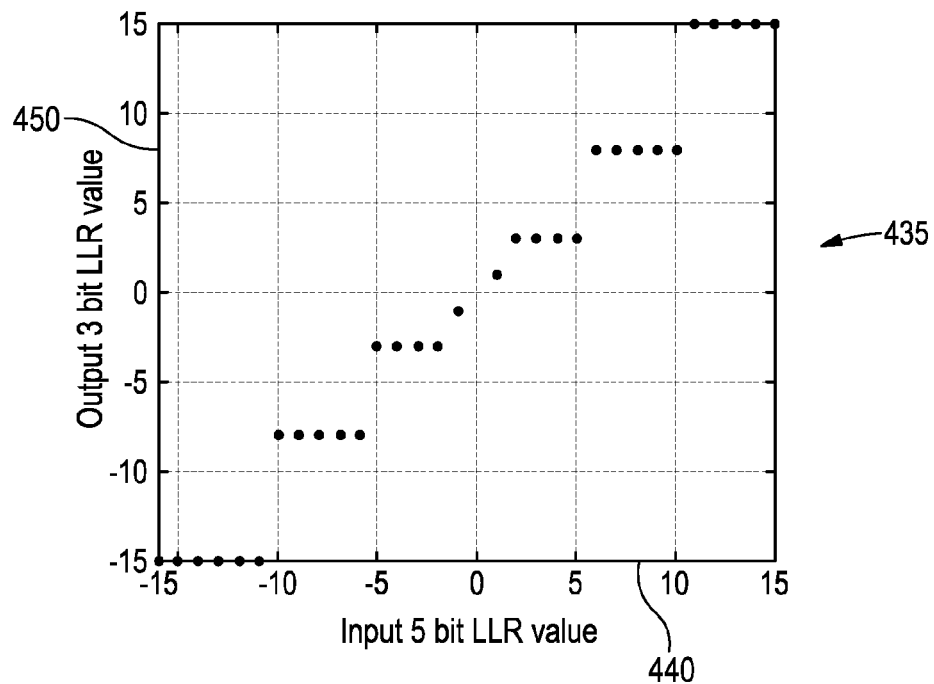
FIG. 8 shows a graph of an alternative conversion of a set of uniformly quantized 5 bit input LLR values to an output of a set of 3 bit non-uniformly quantized output LLR values according to another embodiment.

Further compression of the input LLR values may also be performed, such as from a 5 bit LLR value to 3 bit index values. Table 2, shows conversion of 5 bit input LLR values into 3 bit non-uniform index values. FIG. 8 shows a corresponding graphical representation 435 plotting the input 5 bit LLR values 440 against the output 3 bit LLR values or index values 450. Each 3 bit bin is assigned an index value based on the 5 bit LLR values input into the 3 bit bin. For example, 5 bit inputs −16, −15, −14, −13, −12, and −11 are consolidated to 4 bit index value 000 representing compressed LLR value of −15, whilst 5 bit inputs −10, −9, −8 and −7 are consolidated to 3 bit index value 001 representing compressed LLR value of −8, etc.

After generation of non-uniformly quantized/compressed LLR values, storing in the memory and deinterleaving processes should be done for the bits against the index values of the non-uniformly quantized LLRs. Thus, some examples, less memory in a conventional receiver may be needed, or a lower data rate link to a master processing unit may be required in cases of distributed receiver architecture. Returning to FIG. 1, first N bit uniformly quantized LLRs are generated, then they are compressed/non-uniformly quantized further to (N-ns) bits and their index values are passed to memory and a deinterleaving process is done on these bits. After the deinterleaving process the index bits are converted to actual LLR values and fed to the FEC decoder. These blocks used for non-uniform quantization/compression can also be combined with the demodulator, generating directly the non-uniformly quantized values or their index bits. Additionally, decompression/dequantization can be integrated into a FEC decoder as well.

Figure 9:
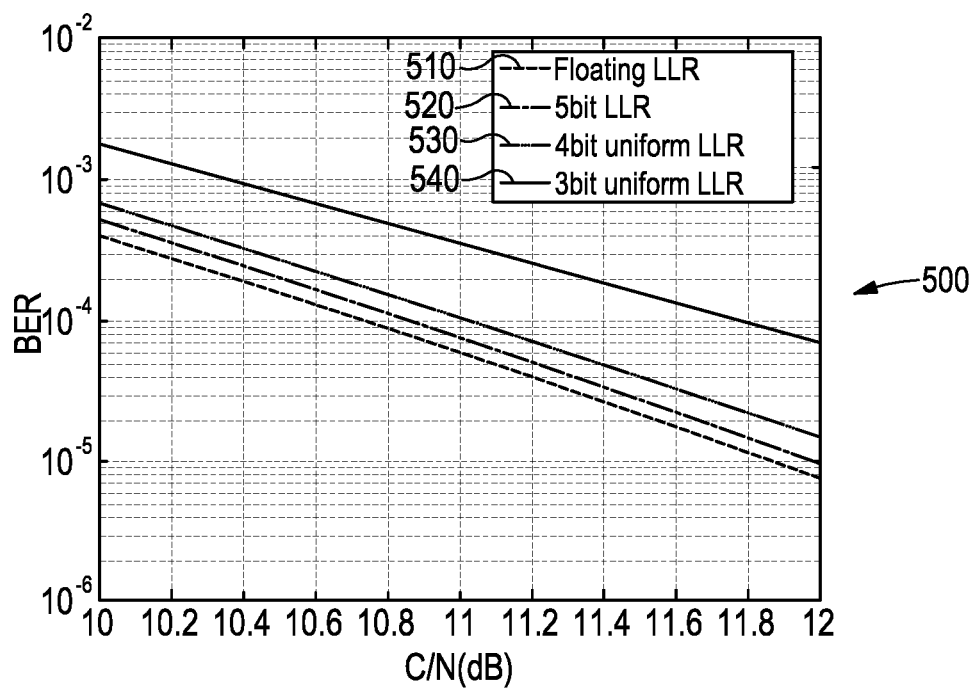
FIG. 9 shows a graph comparing the bit error rate to carrier/noise ratios of a signal processed using conventional LLR compression techniques.

FIG. 9 is a graph 500 showing the performance of a DAB receiver with standard quantization techniques applied. Using floating point 510 to represent the LLRs provides the highest performance with a low carrier to noise ratio and low bit error rates. Using a 5-bit integer 520 to represent to the LLRs results in a performance hit (increased bit error rates) compared to floating point performance 510. Applying a 4 bit 530 and 3 bit 540 uniform quantization to the LLRs provides an increasing performance hit with 3 bit in particular having an unacceptably high bit error rate.

Figure 10:
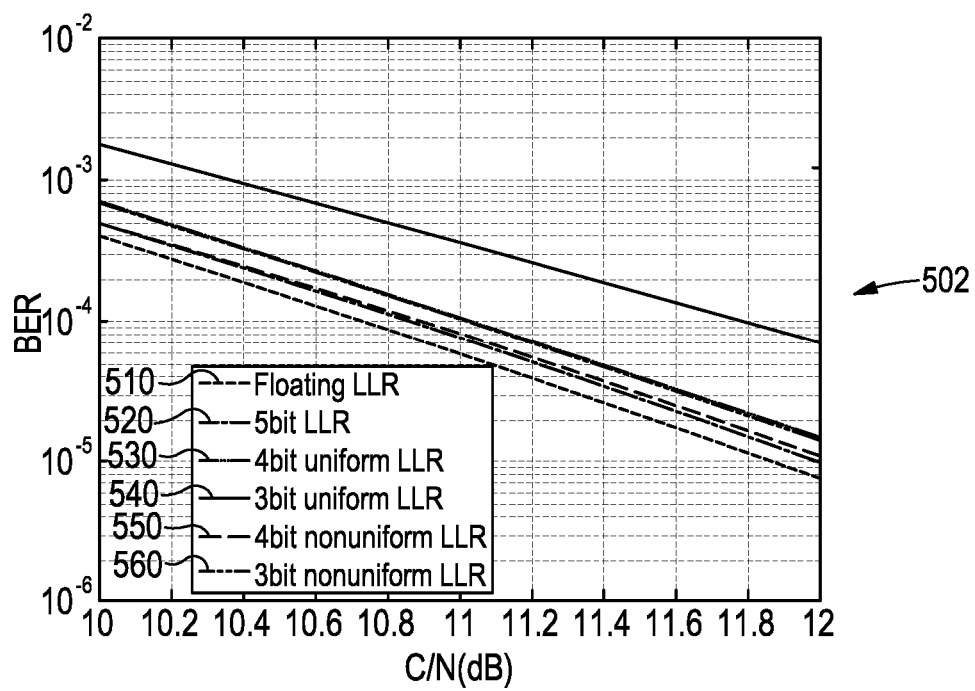
FIG. 10 shows a graph comparing the bit error rate to carrier/noise ratios of the signal of FIG. 9 processed according to embodiments.

FIG. 10 shows the proposed non-uniform quantization/compression using different resolution levels in TU-6 channel with 10 and 50 Hz Doppler frequency. It can be observed that with respect to the conventional uniform quantization 530, 540, the performance loss due to non-uniform quantization, is much less with respect to uniform quantization. It can be noted that the receiver with a 4 bit non-uniform quantization 550 achieves similar performance as the receiver with 5 bit uniformly quantized LLRs 510. Thus, in some examples for this specific performance target one may save 20% of the memory cost or reduce the speed of the data link to send LLRs to another block.

Similarly, with a receiver utilizing a 3 bit non-uniform quantization 560, this receiver achieves similar performance as the receiver with 4 bit uniformly quantized LLRs 530. Thus, in some examples, for this specific performance target one may save 40% of the memory cost or reduce the speed of the data link to send LLRs to another block while sacrificing only very little performance.

Figure 11:
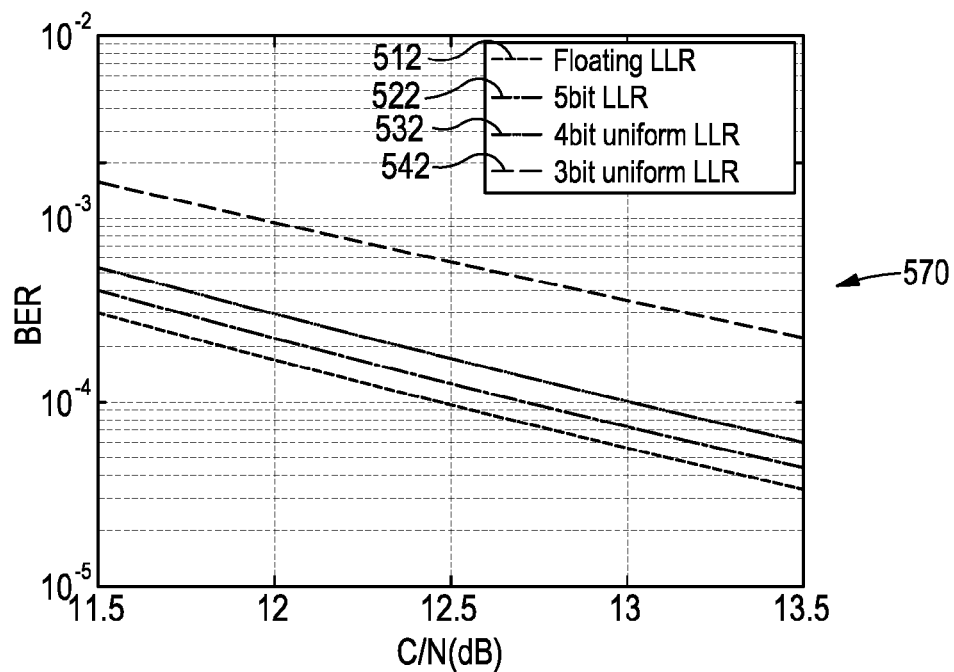
FIG. 11 shows a graph comparing the bit error rate to carrier/noise ratios of the signal of FIG. 9 for an alternative Doppler frequency processed using conventional LLR compression techniques.
Figure 12:
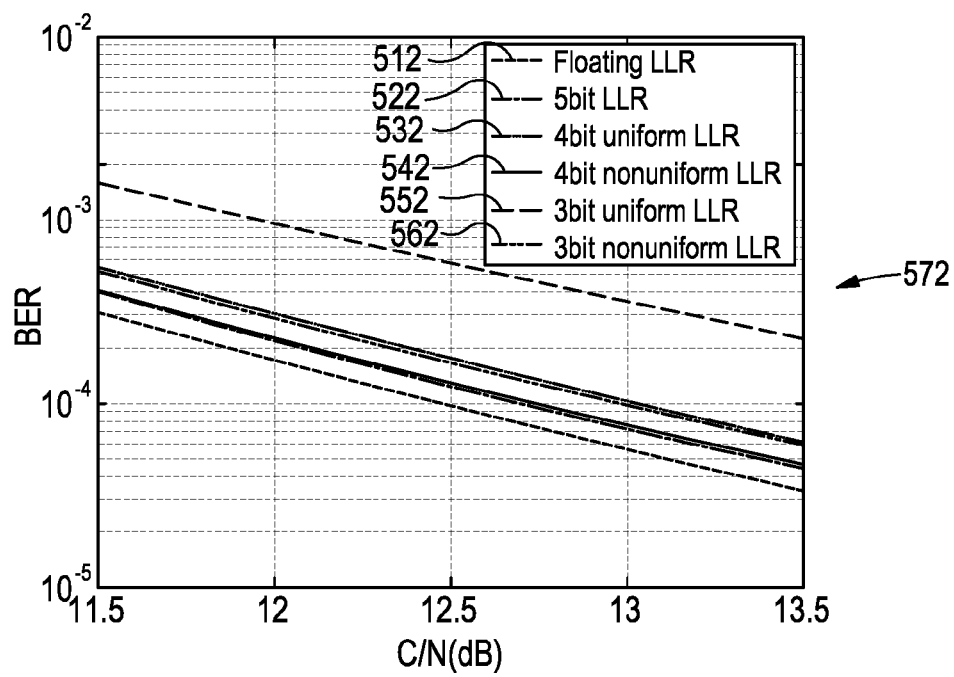
FIG. 12 shows a graph comparing the bit error rate to carrier/noise ratios of a the signal of FIG. 11 processed according to embodiments.

Similar performance enhancements may be seen in some implementations comparing standard uniform quantization techniques 570 for TU-6 channel LLRs as shown in FIG. 11, to non-uniform quantization techniques shown in FIG. 12. FIG. 11 shows floating point 512, 5 bit integer 522, 4 bit uniform quantization 532 and 3 bit uniform quantizations 542 and the associated performance loss as the number of bits used to represent the LLR values decrease. FIG. 12 contrasts the techniques shown in FIG. 11 with non-uniform quantization techniques 572 of 4-bit 552 and 3-bit 562. As with the example shown in FIG. 10, for this example undertaking non-uniform quantization improves the performance.

Figure 13:
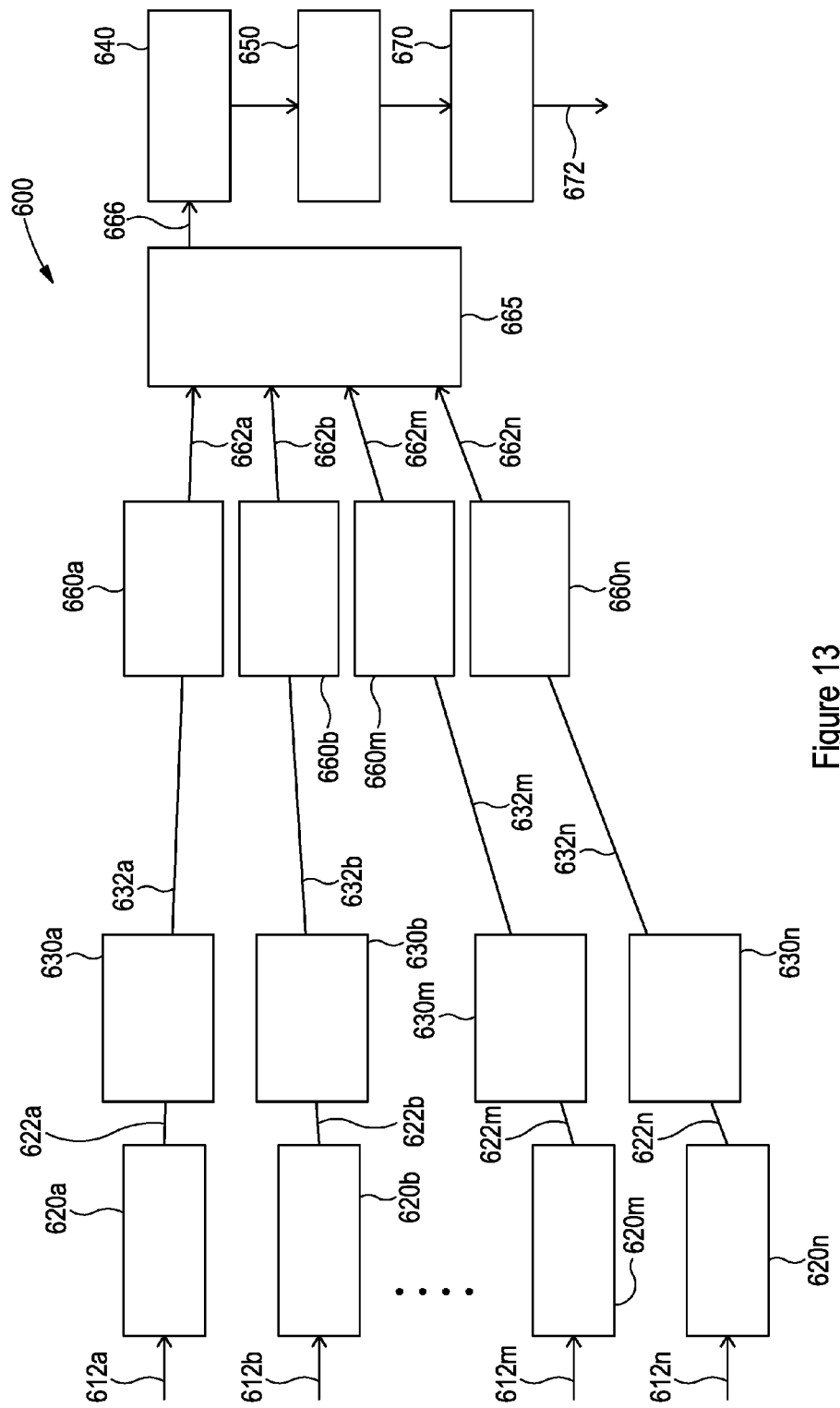
FIG. 13 shows a block diagram of a distributed reception of multiple receivers according to and using embodiments.

FIG. 13 shows an alternative embodiment of the receiver architecture of FIG. 1 that utilizes distributed radios, i.e. multiple receivers. In this embodiment, a receiver system or architecture 600 comprises a series of receivers, each having a demodulator, 620a-n that receives signals with incident bits 612a-n. LLRs 622a-n are generated for each incident signal into each demodulator before being non-uniformly quantized by modules 630a-n to generate compressed (N-ns) bit index values or indices 632a-n as described previously. Each radio also can have a non-uniform dequantization or decompression module 660a-n and provide the decompressed LLR values 662a-n to a weighted simulation module 665 that feeds the weighted output 666 to memory 640 and onto deinterleaver 650 and FEC decoder 670 to provide decoded bits 672 as described above. In this way, a master processing unit can receive the LLRs from different radios, combine these and decode them. Some implementations of this distributed architecture may allow processing power and storage to be improved. By non-uniformly quantizing the LLR values into index values, the data bandwidth requirement may be reduced without significantly affecting bit error noise.

Figure 14:
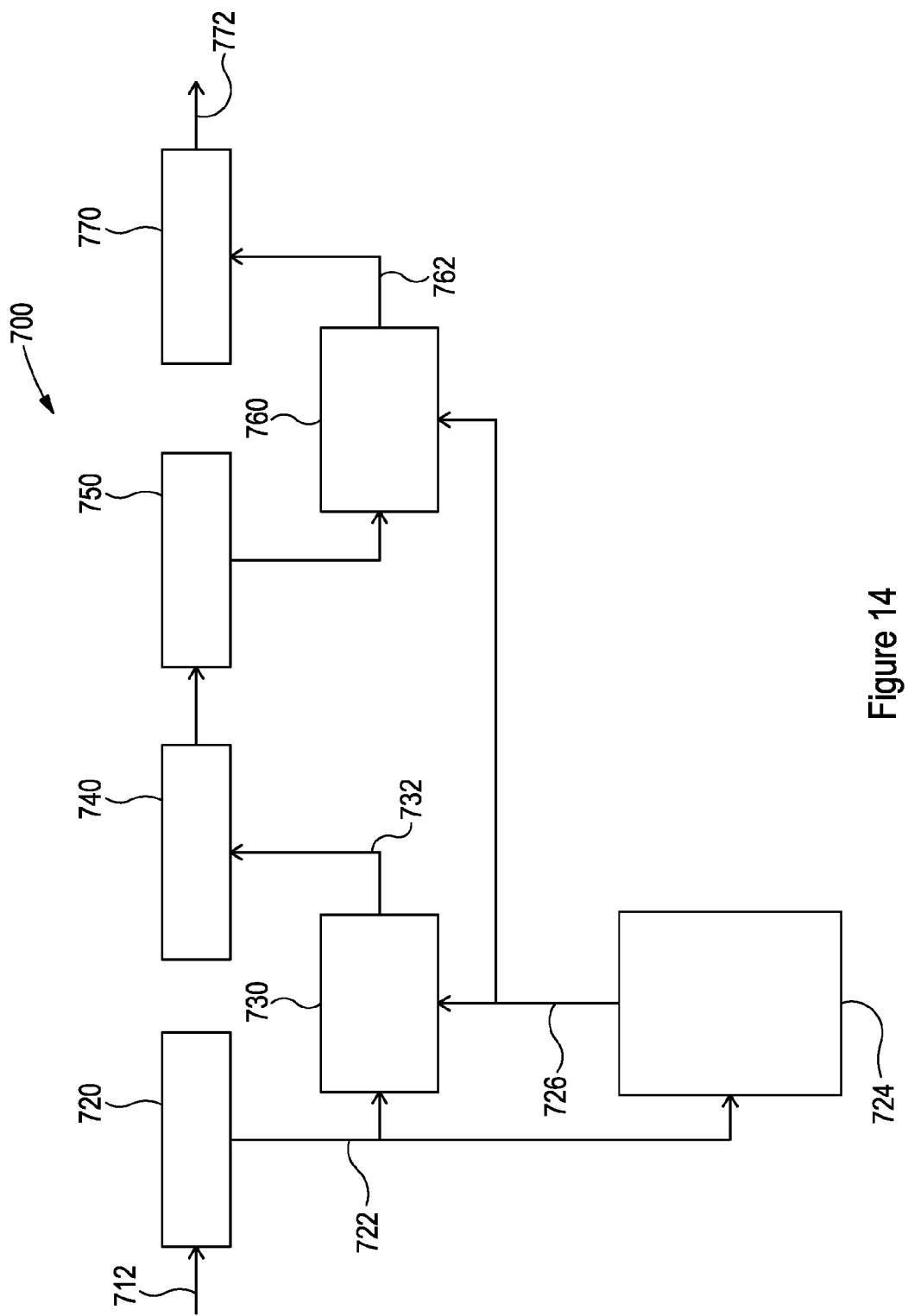
FIG. 14 shows a LLR distribution based adaptive non-uniform quantization of LLRs according to an embodiment.

Depending on the channel realizations and characteristics, scaling of the signals and the initial quantization step of high resolution LLRs, the distribution of LLRs may have a different distribution than the ideal cases, of FIGS. 3-6. It is also possible to choose to adapt how the non-uniform quantization/compression is done. One alternative embodiment is shown in FIG. 14. In this embodiment, which has incident bits 712, demodulator 720, non-uniform quantization module 730, memory 740, deinterleaver 750, non-uniform dequantization module 760 and FEC decoder 770 with decoded bits 772 as above, a non-uniform quantization table 726 is fed to both compression and decompression blocks. In this example, the distribution of the N bit LLR values 722 are checked 724 and an adaptive non-uniform quantization table 724 is selected or generated based on the LLR values 722. The non-uniform quantization and dequantization is then driven, at least in part, by the values of the quantization table 724. The guidelines for determining the non-uniform quantization bins or levels may aim to minimize the additional quantization noise in the process, thus, mostly keeping the values as they are if the probability of an LLR value is very high with respect to other LLR values.

It is also possible to exploit further the differences in probability of each non-uniformly quantized LLR value, e.g., applying Huffmann compression on non-uniformly quantized LLR values and assigning less bits to represent the LLR values that have higher probability and leading to on average less bits to represent the LLRs. In this manner, the output of the non-uniform quantization/compression block in FIG. 14 can give variable length index values for the compressed LLRs.

Figure 15:
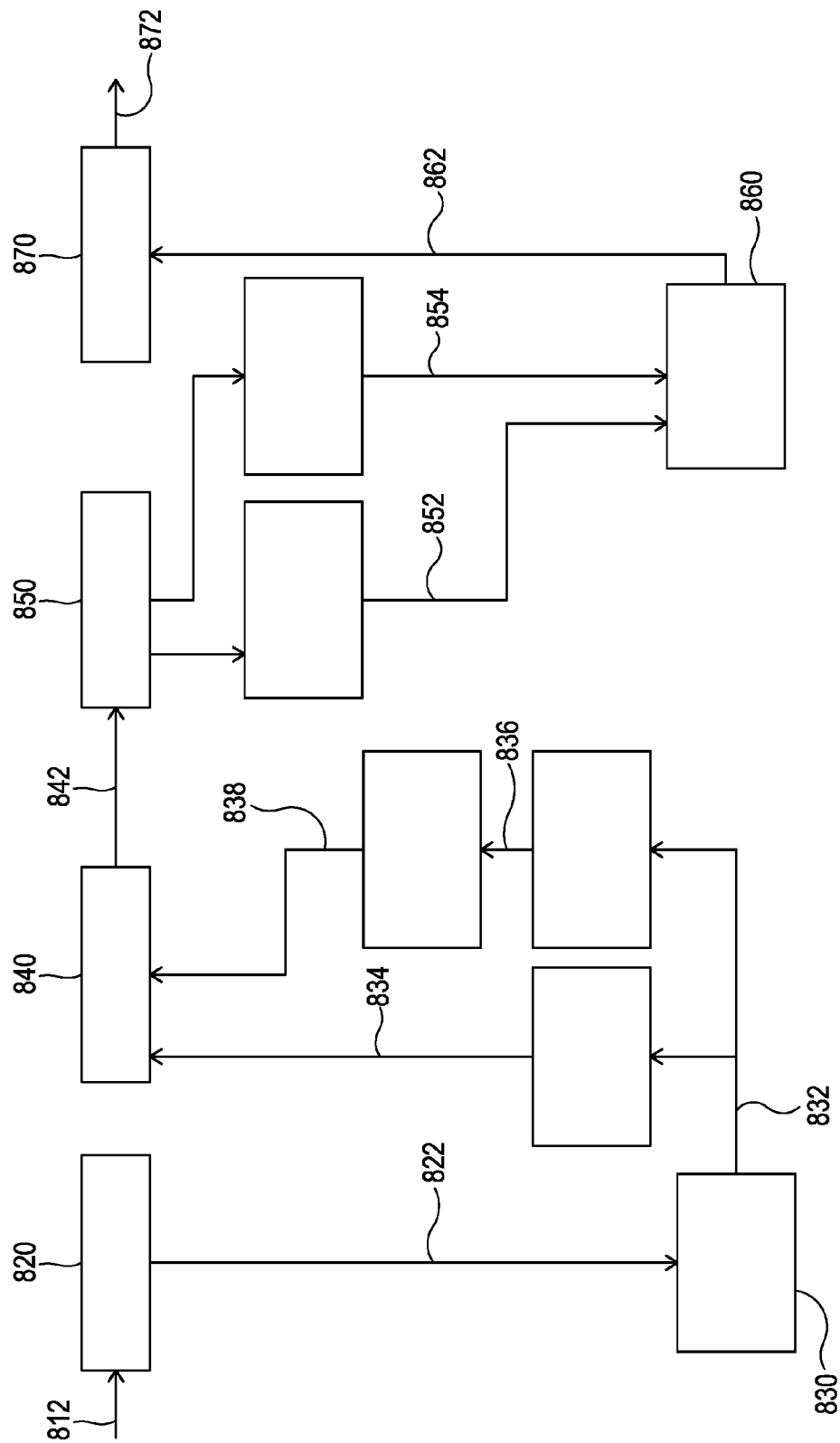
FIG. 15 shows non-uniform LLR quantization with LLR magnitude vector compression according to an embodiment.

In another approach, it is possible to choose to exploit the correlations in successive LLR values. In general, the successive LLRs come from different parts of the encoded bit stream. Thus, the LLRs' signs are uncorrelated. However, due to correlated noise, fading interference or bits coming from the same complex modulated symbols, e.g., bits from the same M-ary Quadrature Amplitude Modulation (M-QAM) symbol, LLRs may have correlated magnitudes. Thus, one example may opt for separating the sign and magnitude of LLRs, and applying conventional data/vector compression methods on the magnitude of LLRs only as in FIG. 15. In this example, the output of the N-bit LLR values 822 are non-uniformly quantized 830 before the index values 832 are analysed 834, 836 such that the sign of the compressed LLRs (i.e. the sign of the index values) is stored in memory separately from the magnitude, which may be further compressed 838. After deinterleaving at the deinterleaver 850, the signs of the compressed LLRs or index values 852 are recombined with the uncompressed LLR magnitude vectors 854 in module 860. The decompressed N bit LLRs 862 are then provided to a FEC decoder 870 to generate decoded bits 872 as above.

Figure 16:
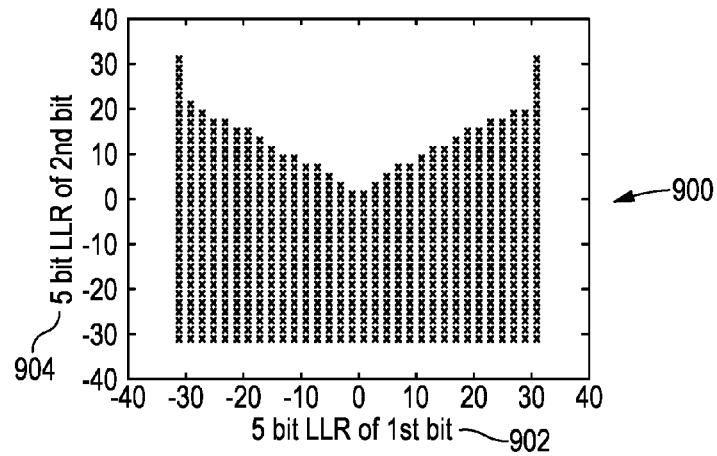
FIG. 16 shows 5 bit LLR realizations of bits from 4-PAM modulated bits with Gray encoding according to an embodiment.

Another approach may apply non-uniform LLR quantization method to LLRs from the same modulated symbol, e.g., LLRs for the bits from the same M-ary Pulse-amplitude modulation (M-PAM), M-ary Pulse-shift keying M-PSK or M-QAM etc. This allows an M dimensional array of non-uniformly quantized values to be determined. In such an approach it is necessary to consider the joint distributions of the LLRs. In FIG. 16, the joint realizations 900 of 5 bit uniformly quantized LLRs 902, 904 coming from the same 4-PAM signal is shown. The non-uniform quantization can be applied directly to individual LLRs. In FIG. 17, joint realizations 910 of non-uniformly quantized LLRs with 3 bits/LLR 912, 914 are shown. It can be appreciated that there should exist 8×8 possible pairs of LLRs by the non-uniform quantization of the LLRs with 3 bits each. However, it can be observed that some of the joint LLRs are not possible. Approximately only ¾ of the possible points are used. Thus, these unused values can be omitted to be represented in the LLR pairs and to obtain a better resolution. For example, 9 levels can be chosen instead of 8 levels. By omitting the not-possible values, the numbers of possible points are reduced to below 64 so that the joint realisations 920 of two pairs of non-uniformly quantized 9 level index values or LLRs can be represented by a total of 6 bits as in FIG. 18. Thus, the non-uniform quantization approach can be applied to 2 dimensions for 4-PAM signals. It can also be extended to log 2(M) dimensions for a M-PAM, MPSK or M-QAM modulation.

From reading the present disclosure, other variations and modifications will be apparent to the skilled person. Such variations and modifications may involve equivalent and other features which are already known in the art of, and which may be used instead of, or in addition to, features already described herein. For example, although wireless signals are typically referred to, the skilled person would appreciate the application of the present disclosure to non-wireless signals, particularly those that utilise interleaving.

Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable sub-combination. The applicant hereby gives notice that new claims may be formulated to such features and/or combinations of such features during the prosecution of the present application or of any further application derived therefrom.

For the sake of completeness it is also stated that the term "comprising" does not exclude other elements or steps, the term "a" or "an" does not exclude a plurality, a single processor or other unit may fulfil the functions of several means recited in the claims and reference signs in the claims shall not be construed as limiting the scope of the claims.

The invention claimed is:

1. A method of processing and decoding data that is represented by a signal carried out by receiver circuitry, the method comprising:
    first circuitry carrying out the steps of
        receiving a plurality of bits,
        calculating a log likelihood ratio, known as a LLR, for each bit,
        providing a LLR value for each bit based on the calculated LLR, and quantizing the LLR values into a plurality of quantization bins based on at least one of a probability density of LLR values and a range of LLR values,
        each quantization bin having
        a width representative of one or more LLR values, and
        an index value having a bit length; and
    second circuitry carrying out the steps of associating each bit with the index value that corresponds to its LLR value, and in response generating decoded output data as derived from the signal,
    wherein the width of each quantization bin is non-uniform.

2. A method as claimed in claim 1, wherein the step of quantizing the LLR values further comprises the step of:
    determining the width of the plurality of quantization bins based on the probability density of LLR values.

3. A method as claimed in claim 1, wherein the step of quantizing the LLR values further comprises the step of:
    determining the width of the plurality of quantization bins based on the range of LLR values.

4. A method as claimed in claim 2, wherein the width of the plurality of the quantization bins is adaptively determined based on the calculated LLRs.

5. A method as claimed in claim 1, wherein the step of providing a LLR value for each bit comprises:
    assigning each bit with an LLR value equal to its calculated LLR.

6. A method as claimed in claim 1, wherein the step of providing a LLR value for each bit further comprises the steps of:
    quantizing the calculated LLRs into a plurality of LLR bins, each LLR bin having:
        a uniform width representative of one or more LLRs; and
        an interim index value having a bit length; and
    assigning each bit with an LLR value equal to the interim index value that corresponds to its LLR bin.

7. A method as claimed in claim 6, wherein the step of quantizing the calculated LLRs into a plurality of LLR bins comprises uniformly quantizing the calculated LLRs into an integer number of LLR bins represented by an interim index value having a number of bits equal to the binary logarithm of the integer number of LLR bins.

8. A method as claimed in claim 6, wherein the step of associating each bit with the index value that corresponds to its LLR value comprises using a table to convert the interim index value of each LLR value to an index value.

9. A method as claimed in claim 1, wherein the step of quantizing the LLR values into a plurality of quantization bins comprises non-uniformly quantizing the LLR values into an integer number of quantization bins represented by an index value having a number of bits equal to the binary logarithm of the integer number of quantization bins.

10. A method as claimed in claim 1, wherein the bit lengths of the index values are variable between quantization bins.

11. A method as claimed in claim 1, further comprising the steps of:
    separating the signs and magnitudes of the index values; and
    applying data compression methods on the magnitudes of the index values.

12. A method as claimed in claim 1, wherein the step of providing a LLR value for each bit further comprising the steps of:
    identifying M number of modulated bits from a wireless signal, where M is at least 2;
    pairing the LLR of the M or more modulated bits to form an LLR pair;
    indexing the LLR pair within an M-dimensional array; and
    determining a LLR value based on a location of the LLR pair within the array.

13. A method as claimed in claim 1, further comprising the steps of:
    storing the plurality of bits and their associated index values within a memory module;

providing the plurality of bits and their associated index values to a de-interleaver;

de-quantizing the index values to extract decompressed LLR values for each bit; and providing the decompressed LLR values and the bits to an decoder for extraction of decoded bits of the signal.

14. A method as claimed in claim 1, wherein the first circuitry includes a demodulator and a quantizer respectively carrying out the steps of calculating a LLR for each bit providing a LLR value for each bit based on the calculated LLR, and wherein the second circuitry includes a deinterleaver and a dequantizer.

15. A receiver responsive to a received signal having a plurality of bits, the receiver comprising: a first circuit configured and arranged to demodulate the received signal by calculating a log likelihood ratio, known as a LLR, for each bit, and providing a LLR value for each bit based on the calculated LLR, and to process the LLR values by quantizing the LLR values into a plurality of quantization bins, each quantization bin having a width representative of one or more LLR values and having an index with a bit length; and other circuitry configured and arranged to associate each bit with the index value that corresponds to its LLR value, wherein the width of each quantization bin is non-uniform.

16. A communication system comprising one or more receivers, at least one of the one or more receivers set forth in claim 15.

17. A receiver as claimed in claim 15, wherein the first circuit includes a demodulator and a quantizer and the other circuitry includes a deinterleaver and a dequantizer.

18. A receiver as claimed in claim 15, wherein the first circuit includes a quantizer configured and arranged to quantize the LLR values and to determine the width of the plurality of quantization bins based on at least one of the probability density of LLR values and a range of LLR values.

* * * * *